US011035901B2

(12) United States Patent
Yoshida

(10) Patent No.: US 11,035,901 B2
(45) Date of Patent: Jun. 15, 2021

(54) STATE OUTPUT APPARATUS, STATE OUTPUT METHOD, AND RECORDING MEDIUM

(71) Applicant: Masaaki Yoshida, Osaka (JP)

(72) Inventor: Masaaki Yoshida, Osaka (JP)

(73) Assignee: Ricoh Company, Ltd., Tokyo (JP)

(*) Notice: Subject to any disclaimer, the term of this patent is extended or adjusted under 35 U.S.C. 154(b) by 134 days.

(21) Appl. No.: 15/581,311

(22) Filed: Apr. 28, 2017

(65) Prior Publication Data

US 2017/0370996 A1 Dec. 28, 2017

(30) Foreign Application Priority Data

Jun. 22, 2016 (JP) .............................. JP2016-123891

(51) Int. Cl.
*G01R 31/364* (2019.01)
*G01R 31/36* (2020.01)
*G01R 31/392* (2019.01)

(52) U.S. Cl.
CPC ....... *G01R 31/3648* (2013.01); *G01R 31/392* (2019.01)

(58) Field of Classification Search
CPC .................................................. G01R 31/3648
See application file for complete search history.

(56) References Cited

U.S. PATENT DOCUMENTS

| 9,506,988 B2 | 11/2016 | Sejima et al. |
| 9,620,962 B2 | 4/2017 | Yoshida et al. |
| 2002/0109506 A1* | 8/2002 | Kawakami ........... G01R 31/389 324/522 |
| 2008/0231238 A1* | 9/2008 | Wong ..................... B60L 53/11 320/161 |
| 2012/0176092 A1 | 7/2012 | Fujii et al. |

(Continued)

FOREIGN PATENT DOCUMENTS

| JP | 2012-202687 | 10/2012 |
| JP | 5282789 | 9/2013 |

(Continued)

OTHER PUBLICATIONS

Office Action dated Jan. 7, 2020 issued with respect to the corresponding Japanese Patent Application No. 2016-123891.

*Primary Examiner* — John E Breene
*Assistant Examiner* — Jeffrey C Morgan
(74) *Attorney, Agent, or Firm* — IPUSA, PLLC

(57) ABSTRACT

A state output apparatus includes a power storage device information acquirer configured to acquire power storage device information including a voltage and a current of a power storage device; an integrated current amount calculator configured to calculate an integrated current amount supplied to the power storage device during a period in which the voltage changes from a first voltage to a second voltage between a discharge end voltage and a charge end voltage by charging the power storage device; an integrated current amount comparer configured to compare the calculated integrated current amount with a reference integrated current amount stored in a storage device; and a state outputter configured to output a result of the comparison as information indicating a state of the power storage device.

16 Claims, 10 Drawing Sheets

(56) References Cited

U.S. PATENT DOCUMENTS

| | | | |
|---|---|---|---|
| 2013/0127611 A1* | 5/2013 | Bernstein | G08B 21/18 340/455 |
| 2015/0073614 A1 | 3/2015 | Yoshida et al. | |
| 2015/0357837 A1 | 12/2015 | Takai et al. | |
| 2016/0069964 A1 | 3/2016 | Takahashi et al. | |
| 2016/0185340 A1 | 6/2016 | Yoshida et al. | |
| 2016/0325633 A1 | 11/2016 | Yoshida et al. | |
| 2017/0140021 A1* | 5/2017 | Gopi | G06F 16/278 |

FOREIGN PATENT DOCUMENTS

| | | |
|---|---|---|
| JP | 2014-167457 | 9/2014 |
| JP | 2015-8614 | 1/2015 |
| JP | 2016-126887 | 7/2016 |

\* cited by examiner

FIG.5

| TEMPERATURE [°C] | INTEGRATION START VOLTAGE [V] | INTEGRATION END VOLTAGE [V] | REFERENCE INTEGRATED CURRENT AMOUNT [Ah] 49 |
|---|---|---|---|
| 0~10 | 3.9 | 4.1 | ... |
| 11~20 | 3.8 | 4.1 | ... |
| 21~30 | 3.7 | 4.0 | ... |
| 31~40 | 3.6 | 3.9 | ... |
| ... | | | ... |

FIG.10A

| TEMPERATURE [°C] | INTEGRATION START VOLTAGE [V] | INTEGRATION END VOLTAGE [V] | REFERENCE INTEGRATED CURRENT AMOUNT [Ah] |
|---|---|---|---|
| 0~10 | 3.9 | 4.1 | ... |
| | 3.8 | 4.1 | ... |
| | 3.7 | 4.0 | ... |
| | 3.6 | 3.9 | ... |
| | ... | ... | ... |

| TEMPERATURE [°C] | INTEGRATION START VOLTAGE [V] | INTEGRATION END VOLTAGE [V] | REFERENCE INTEGRATED CURRENT AMOUNT [Ah] |
|---|---|---|---|
| 11~20 | 3.8 | 4.1 | ... |
| | 3.7 | 4.0 | ... |
| | 3.6 | 3.9 | ... |
| | 3.5 | 3.8 | ... |
| | ... | ... | ... |

| TEMPERATURE [°C] | INTEGRATION START VOLTAGE [V] | INTEGRATION END VOLTAGE [V] | REFERENCE INTEGRATED CURRENT AMOUNT [Ah] |
|---|---|---|---|
| 21~30 | 3.7 | 4.0 | ... |
| | 3.6 | 3.9 | ... |
| | 3.5 | 3.8 | ... |
| | ... | ... | ... |

FIG.10D 49-4

| TEMPERATURE [°C] | INTEGRATION START VOLTAGE [V] | INTEGRATION END VOLTAGE [V] | REFERENCE INTEGRATED CURRENT AMOUNT [Ah] |
|---|---|---|---|
| 31~40 | 3.6 | 3.9 | ... |
| | 3.5 | 3.8 | ... |
| | 3.4 | 3.7 | ... |
| | ... | ... | ... |

STATE OUTPUT APPARATUS, STATE OUTPUT METHOD, AND RECORDING MEDIUM

CROSS-REFERENCE TO RELATED APPLICATION

The present application claims priority under 35 U.S.C. § 119 to Japanese Patent Application No. 2016-123891, filed on Jun. 22, 2016, the contents of which are incorporated herein by reference in their entirety.

BACKGROUND OF THE INVENTION

1. Field of the Invention

The present invention relates to a state output apparatus, a state output method of the power storage device, and a recording medium.

2. Description of the Related Art

Conventionally, there is known a movable body such as a hybrid vehicle and an electric vehicle, etc., in which a power storage device such as a battery is installed, and in which a motor is driven by the power from the power storage device.

Furthermore, the power storage device is known to deteriorate, both by being used and by being abandoned without being used. This deterioration largely affects the fuel consumption amount per unit distance in the movable body. Furthermore, when the power storage device rapidly deteriorates, a failure occurs in that the movable body, which has been moving, suddenly stops moving, etc. Therefore, conventionally, there has been demand to precisely estimate the status of deterioration of the power storage device.

As one example of a technique of estimating the status of deterioration of the power storage device, there is already known a technique of calculating the deterioration of a lithium ion battery including a plurality of inflection points indicating changes that clarify the correlation between the battery voltage and the remaining battery amount, based on the initial full charge amount of the power storage device and the full charge amount after the power storage device has been used. In this technique, the full charge amounts before and after using the battery are calculated to estimate the deterioration state of the lithium ion battery.

Patent Document 1: Japanese Patent No. 5282789

SUMMARY OF THE INVENTION

An aspect of the present invention provides a state output apparatus, a state output method of the power storage device, and a recording medium, in which one or more of the disadvantages of the related art are reduced.

According to one aspect of the present invention, there is provided a state output apparatus including a power storage device information acquirer configured to acquire power storage device information including a voltage and a current of a power storage device; an integrated current amount calculator configured to calculate an integrated current amount supplied to the power storage device during a period in which the voltage changes from a first voltage to a second voltage between a discharge end voltage and a charge end voltage by charging the power storage device; an integrated current amount comparer configured to compare the calculated integrated current amount with a reference integrated current amount stored in a storage device; and a state outputter configured to output a result of the comparison as information indicating a state of the power storage device.

BRIEF DESCRIPTION OF THE DRAWINGS

Other objects, features and advantages of the present invention will become more apparent from the following detailed description when read in conjunction with the accompanying drawings, in which:

FIG. 5 illustrates an example of an integrated current amount table according to the first embodiment of the present invention;

FIGS. 10A through 10D illustrate examples of integrated current amount tables according to the second embodiment of the present invention.

DETAILED DESCRIPTION OF THE PREFERRED EMBODIMENTS

In the technique of the related art, in order to estimate the deterioration state of the power storage device, the power storage device needs to be completely discharged, and therefore the user's convenience is significantly hampered and the power storage device is deteriorated.

A problem to be solved by an embodiment of the present invention is to detect the state of the power storage device without completely discharging the power storage device.

First Embodiment

A first embodiment of the present invention will be described by referring to the accompanying drawings. In the present embodiment, the state of the power storage device is detected according to the integrated current amount (current capacity) integrated during a period in which the voltage of the power storage device changes from a first predetermined voltage to a second predetermined voltage, between a discharge end voltage and a charge end voltage set in the power storage device. In the following description, the first predetermined voltage is referred to as an integration start voltage and the second predetermined voltage is referred to as an integration end voltage.

Figure 1:
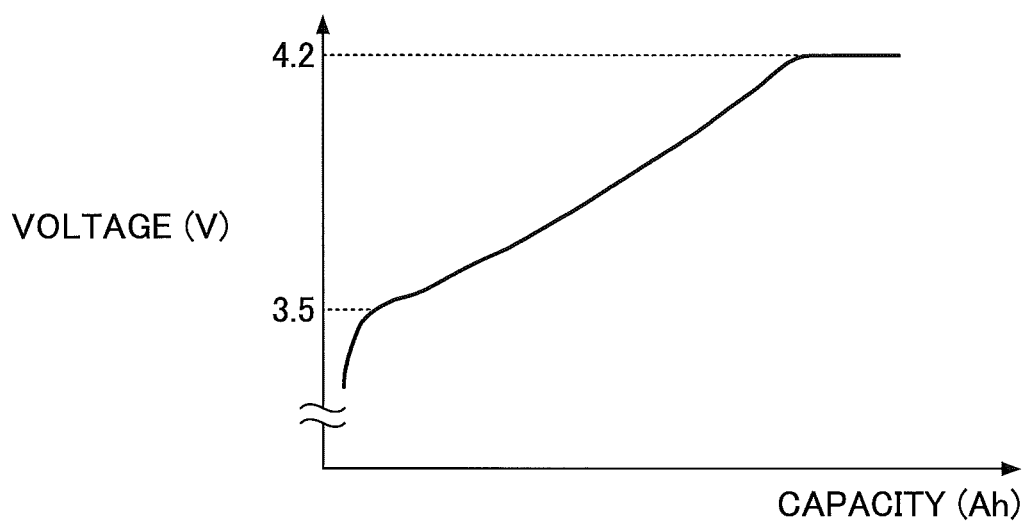
FIG. 1 illustrates the property of a power storage device of the related art.

FIG. 1 illustrates the property of a power storage device. The power storage device according to the present embodiment is, for example, a lithium ion battery, and FIG. 1 illustrates the charging property of a general lithium ion battery. A general lithium ion battery uses, for example, NCA (nickel, cobalt, and aluminum) as a positive-electrode active material. In this case, as illustrated in FIG. 1, the power storage device has a charging property that increases relatively monotonously, from near 3.5 V to 4.2 V that is the charge end voltage.

Figure 2:
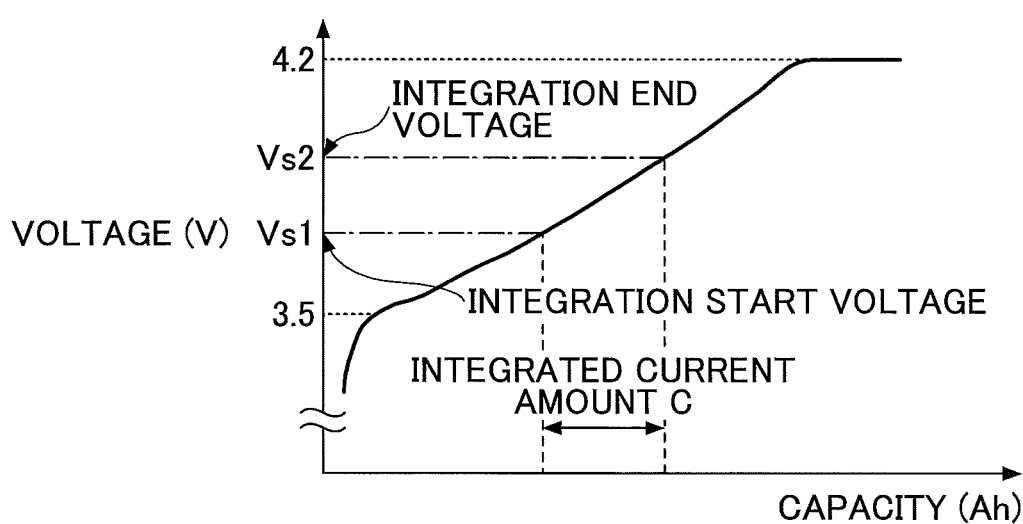
FIG. 2 is for describing an integration start voltage and an integration end voltage according to a first embodiment of the present invention.

FIG. 2 is for describing an integration start voltage and an integration end voltage. An integration start voltage Vs1 and an integration end voltage Vs2 are set between the voltage of near 3.5 V and the charge end voltage 4.2 V where the charging property of the power storage device indicates a monotonous increase trend. Then, in the present embodiment, the power storage device is charged during a period in which the voltage of the power storage device changes from the integration start voltage Vs1 to the integration end voltage Vs2, and the integrated current amount integrated during this period is calculated. In other words, in the present embodiment, according to the charging operation during the period in which the voltage of the power storage device changes from the integration start voltage Vs1 to the integration end voltage Vs2, an integrated current amount (current capacity) C supplied to the power storage device is calculated.

Then, in the present embodiment, this integrated current amount C is compared with a reference integrated current amount (reference current capacity) Cs calculated when the power storage device is shipped from a factory, to detect the state of the power storage device. The reference integrated current amount Cs is the integrated current amount when the power storage device is charged until the voltage of the power storage device changes from the integration start voltage Vs1 to the integration end voltage Vs2, at the time of factory shipment. In other words, the reference integrated current amount Cs is the integrated current amount from when the voltage of the power storage device changes from the integration start voltage Vs1 to the integration end voltage Vs2, in a state where the power storage device is not yet used and is not deteriorated.

In the present embodiment, as described above, the state of the power storage device is detected based on the integrated current amount C integrated during a period in which the voltage of the power storage device changes from the integration start voltage Vs1 to the integration end voltage Vs2, and the reference integrated current amount Cs. Therefore, the state of the power storage device can be detected without completely discharging the power storage device. More specifically, the level of deterioration of the power storage device can be detected.

In the following, a description is given of a state output apparatus that outputs the state of the power storage device by applying the above method.

Figure 3:
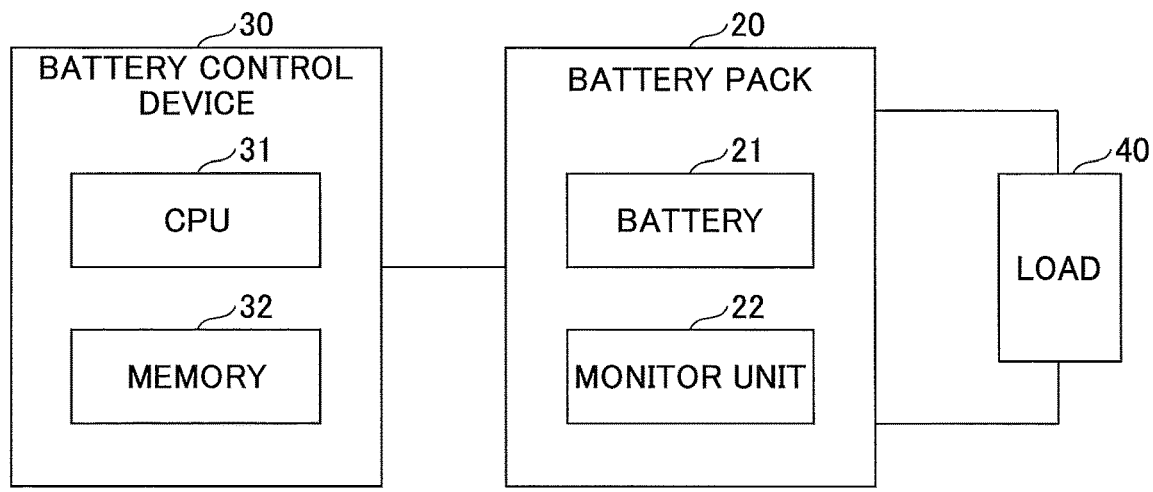
FIG. 3 illustrates an example of an electronic device to which a state output apparatus according to the first embodiment of the present invention is applied.

FIG. 3 illustrates an example of an electronic device to which a state output apparatus is applied. An electronic device 10 according to the present embodiment includes a battery pack 20, a battery control device 30, and a load 40.

The battery pack 20 according to the present embodiment includes a battery 21 and a monitor unit 22. The battery 21 according to the present embodiment is a power storage device that can be charged and discharged, such as a lithium ion battery. The battery pack 20 according to the present embodiment is to include at least one battery 21; however, two or more batteries 21 may be connected in series or connected in parallel, for the purpose of increasing the output.

The monitor unit 22 acquires information indicating the state of the battery 21, and outputs the acquired information to the battery control device 30. Specifically, the monitor unit 22 according to the present embodiment may include a voltage sensor, a current sensor, and a temperature sensor, etc., and may acquire the voltage of the battery 21, the current charged to the battery 21, and the temperature of the battery 21, etc. Note that the battery 21 may be charged by having, for example, a battery charger coupled to the electronic device 10.

The battery control device 30 according to the present embodiment includes a Central Processing Unit (CPU) 31 and a memory 32.

The CPU 31 executes programs stored in the memory 32, and controls various operations of the battery pack 20. The memory 32 stores information obtained as a result of processes executed by the CPU 31, and various programs, etc. The programs stored in the memory 32 include a state output program.

The battery control device 30 according to the present embodiment detects the state of the battery 21 as the CPU 31 executes the state output program and outputs a detection result. That is, the battery control device 30 according to the present embodiment plays the role of the state output apparatus. Details of functions of the battery control device 30 according to the present embodiment are described below.

Note that in the present embodiment, the battery control device 30 plays the role of the state output apparatus; however, the present embodiment is not so limited. The state output apparatus may be, for example, the electronic device 10 according to the present embodiment, or may include the battery pack 20 and the battery control device 30.

The load 40 includes various electronic circuits included in the electronic device 10, and receives power supply from the battery pack 20.

Figure 4:
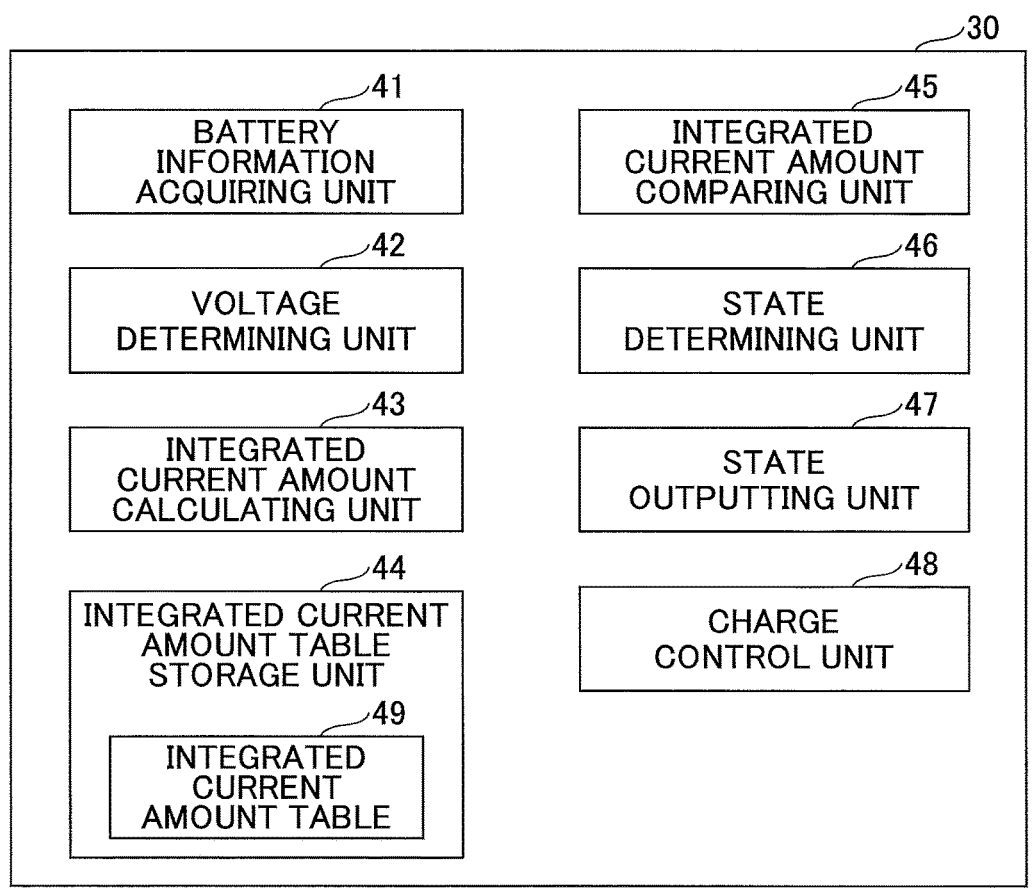
FIG. 4 illustrates functions of a battery control device according to the first embodiment of the present invention.

Next, by referring to FIG. 4, a description is given of functions of the battery control device 30. FIG. 4 illustrates functions of the battery control device 30 according to the first embodiment. The units illustrated in FIG. 4 are realized as the CPU 31 executes the state output program stored in the memory 32.

The battery control device 30 according to the present embodiment includes a battery information acquiring unit 41, a voltage determining unit 42, an integrated current amount calculating unit 43, an integrated current amount table storage unit 44, an integrated current amount comparing unit 45, a state determining unit 46, a state outputting unit 47, and a charge control unit 48.

The battery information acquiring unit 41 acquires information of the battery 21, including the voltage, the current, and the temperature of the battery 21 acquired by the monitor unit 22 of the battery pack 20. In the following description, the information acquired from the monitor unit 22 is referred to as battery information.

The voltage determining unit 42 detects the integration start voltage Vs1 and the integration end voltage Vs2, based on the battery voltage acquired from the monitor unit 22 of the battery pack 20.

The integrated current amount calculating unit 43 calculates the integrated current amount C supplied to the battery pack 20, during a period in which the battery voltage changes from the integration start voltage Vs1 to the integration end voltage Vs2, when the battery 21 is charged.

The integrated current amount table storage unit 44 stores an integrated current amount table 49 in a predetermined storage area, etc., of the memory 32. The integrated current amount table 49 stores the reference integrated current amount Cs, which is compared with the integrated current amount calculated by the integrated current amount calculating unit 43. Details of the integrated current amount table 49 are described below.

The integrated current amount comparing unit 45 acquires the integrated current amount calculated by the integrated current amount calculating unit 43, the temperature included in the information acquired from the monitor unit 22, and the reference integrated current amount Cs that is the comparison target stored in the integrated current amount table 49. Then, the integrated current amount comparing unit 45 compares the calculated integrated current amount with the reference integrated current amount acquired from the integrated current amount table 49.

The state determining unit 46 determines the state of the battery 21, according to the result of comparison by the integrated current amount comparing unit 45. Specifically, the state determining unit 46 determines the degree of deterioration of the battery 21, according to the difference between the integrated current amount calculated by the integrated current amount calculating unit 43 and the reference integrated current amount acquired from the integrated current amount table 49.

The state outputting unit 47 outputs the result of determination by the state determining unit 46. For example, when the electronic device 10 includes a display unit such as a display, the state outputting unit 47 according to the present embodiment may display the determination result on the display unit.

Furthermore, when the electronic device 10 includes a light source that can be turned on and off, the state outputting unit 47 may control the turning on and off of this light source to report the determination result. The light source may be, for example, a light emitting diode (LED) provided in the housing case of the electronic device 10. Furthermore, the state outputting unit 47 may report the determination result by voice sound or vibration, etc., other than by a light source. Furthermore, the state outputting unit 47 may output the determination result to an external device that can communicate with the electronic device 10.

The charge control unit 48 determines whether it is possible to charge the battery 21. Furthermore, the charge control unit 48 controls the charging of the battery 21, in the process of outputting the state of the battery 21.

Next, by referring to FIG. 5, a description is given of the integrated current amount table 49 according to the present embodiment. FIG. 5 illustrates an example of the integrated current amount table 49 according to the first embodiment.

The integrated current amount table 49 according to the present embodiment is a table that is provided in the battery control device 30 in advance. The integrated current amount table 49 according to the present embodiment includes, as information items, the temperature, an integration start voltage, an integration end voltage, and a reference integrated current amount.

The value of the item "temperature" indicates the temperature of the battery 21. The value of the item "integration start voltage" indicates the value of the integration start voltage Vs1, and the value of the item "integration end voltage" indicates the value of the integration end voltage Vs2. The value of the item "reference integrated current amount" is the reference integrated current amount integrated during a period in which the battery voltage of the battery 21 changes from the integration start voltage Vs1 to the integration end voltage Vs2.

All of the reference integrated current amounts stored in the integrated current amount table 49 according to the present embodiment are values that have been measured at the time when the battery 21 is shipped from the factory, etc. Said differently, the reference integrated current amount stored in the integrated current amount table 49 indicates the integrated current amount integrated during a period in which the battery voltage changes from the integration start voltage Vs1 to the integration end voltage Vs2 before using the battery 21, i.e., in a state where the battery 21 is not deteriorated.

Furthermore, the value of the reference integrated current amount stored in the integrated current amount table 49 according to the present embodiment varies according to the design of the battery 21, and the configuration of an upper level device in which the battery control device 30 is installed. Specifically, assuming that the integrated current amount of the entire battery 21 is 100%, the reference integrated current amount according to the present embodiment may be approximately 10% of the integrated current amount of the entire battery 21.

Furthermore, in the integrated current amount table 49, different values of the integration start voltage Vs1 and the integration end voltage Vs2 are associated with each temperature level; however, with respect to the reference integrated current amount, different values may be set as according to the temperature, or a fixed value may be set regardless of the temperature.

In the integrated current amount table 49 of FIG. 5, for example, when the temperature is 0° C. through 10° C., the integration start voltage Vs1 is 3.9 V and the integration end voltage Vs2 is 4.1 V; and when the temperature is 11° C. through 20° C., the integration start voltage Vs1 is 3.8 V and the integration end voltage Vs2 is 4.1 V. Furthermore, in the integrated current amount table 49, when the temperature is 21° C. through 30° C., the integration start voltage Vs1 is 3.7 V and the integration end voltage Vs2 is 4.0 V; and when the temperature is 31° C. through 40° C., the integration start voltage Vs1 is 3.6 V and the integration end voltage Vs2 is 3.9 V.

As seen in FIG. 5, in the present embodiment, as the temperature increases, the integration start voltage Vs1 and the integration end voltage Vs2 are set at low values.

In the present embodiment, by associating the integration start voltage Vs1, the integration end voltage Vs2, and the reference integrated current amount with each other for each temperature level as described above, the state of the battery 21 can be determined in consideration of the impact caused by the temperature of the battery 21.

Figure 6:
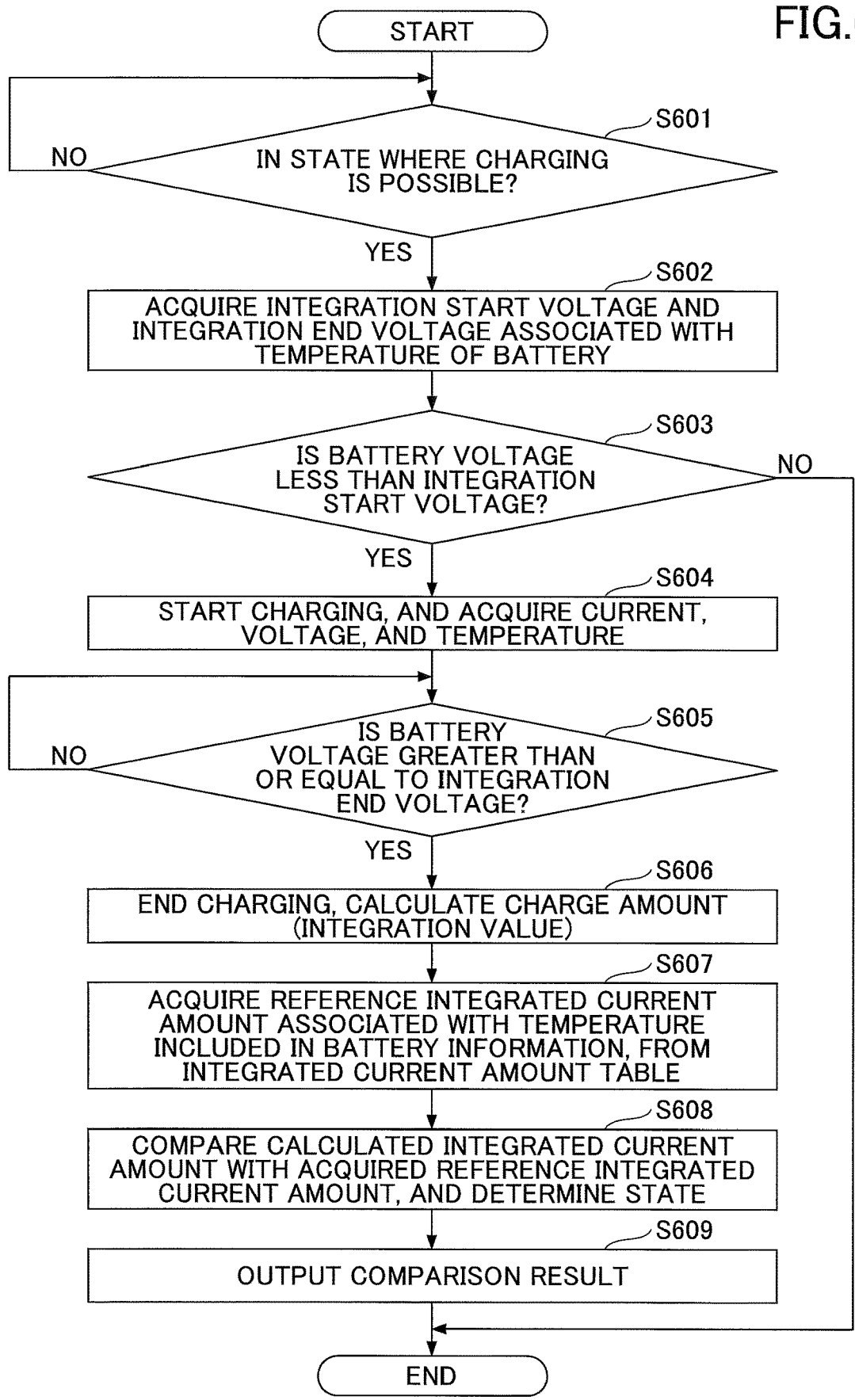
FIG. 6 is a flowchart for describing the operations by the battery control device according to the first embodiment of the present invention.

Next, by referring to FIG. 6, a description is given of operations by the battery control device 30 according to the present embodiment. FIG. 6 is a flowchart for describing the operations by the battery control device 30 according to the first embodiment.

The battery control device 30 according to the present embodiment determines, by the charge control unit 48, whether the battery 21 is in a state where charging is possible (step S601). A state where charging is possible is, for example, a state in which a power supply source such as a battery charger is coupled to the battery pack 20.

In step S601, when the battery 21 is not in a state where charging is possible, the battery control device 30 waits until the battery 21 switches to a state where charging is possible.

In step S601, when the battery 21 is in a state where charging is possible, the battery control device 30 starts acquiring (collecting) battery information by the battery information acquiring unit 41, and acquires the integration start voltage Vs1 and the integration end voltage Vs2 associated with the temperature included in the battery information in the integrated current amount table 49 (step S602).

Next, the battery control device 30 determines, by the voltage determining unit 42, whether the battery voltage is less than the integration start voltage Vs1, based on the battery pack 20 (step S603). In step S603, when the battery voltage is greater than or equal to the integration start voltage Vs1, the battery control device 30 does not determine the state with respect to the current charging operation, and ends the process.

In the following, a description is given of the determination in step S603. In the present embedment, when the battery 21 switches to a state where charging is possible, and the battery voltage is greater than or equal to the integration start voltage Vs1, it is not possible to calculate the integrated current amount integrated during a period in which the battery voltage changes from the integration start voltage Vs1 to the integration end voltage Vs2. Therefore, when the battery voltage is greater than or equal to the integration start voltage Vs1, the battery control device 30 according to the present embodiment does not perform the process of determining the state of the battery. At the next time when the battery 21 switches to a state where charging is possible, the process of FIG. 6 is executed again from step S601.

In step S603, when the battery voltage is less than the integration start voltage Vs1, the battery control device 30 starts acquiring (collecting) the battery information by the battery information acquiring unit 41, and further starts to charge the battery 21 by the charge control unit 48 (step S604).

Next, the battery control device 30 determines, by the voltage determining unit 42, whether the battery voltage included in the battery information is greater than or equal to the integration end voltage Vs2 (step S605). In step S605, when the battery voltage is not greater than or equal to the integration end voltage Vs2, that is, when the battery voltage is less than the integration end voltage Vs2, the battery control device 30 waits until the battery voltage reaches the integration end voltage Vs2.

In step S605, when the battery voltage is greater than or equal to the integration end voltage Vs2, the battery control device 30 stops charging the battery 21 by the charge control unit 48, and calculates, by the integrated current amount calculating unit 43, the integrated current amount integrated during the period from when the charging has started to when the charging has ended (step S606).

Next, the battery control device 30 refers to the integrated current amount table 49 by the integrated current amount comparing unit 45, and acquires the reference integrated current amount Cs that is associated with the temperature included in the battery information in the integrated current amount table 49 (step S607).

Next, the battery control device 30 compares, by the integrated current amount comparing unit 45, the integrated current amount calculated in step S606 with the reference integrated current amount Cs acquired in step S607, and determines the state of the battery 21 by the state determining unit 46 (step S608).

Next, the battery control device 30 outputs, by the state outputting unit 47, the result of determining the state of the battery 21 (step S609), and ends the process.

In the following, the process of step S608 is specifically described. In the present embodiment, the integrated current amount comparing unit 45 calculates the ratio of the integrated current amount C calculated in step S606, with respect to the integrated current amount C acquired from the integrated current amount table 49. Then, the state determining unit 46 outputs the state of the battery 21 indicated by the calculated ratio.

For example, in a case where the ratio is indicated by a percentage, as the ratio of the integrated current amount C with respect to the reference integrated current amount Cs becomes closer to 100%, the battery 21 is considered to be less deteriorated. Furthermore, as the ratio of the integrated current amount C with respect to the reference integrated current amount Cs becomes closer to 0%, the battery 21 is considered to be more deteriorated.

Therefore, for example, the state determining unit 46 according to the present embodiment determines the state of the battery 21 according to the ratio of the integrated current amount C with respect to the reference integrated current amount Cs. For example, when the ratio of the integrated current amount C with respect to the reference integrated current amount Cs is less than 70%, the state determining unit 46 may determine that the state of the battery 21 is a deteriorated state.

Furthermore, when the ratio of the integrated current amount C with respect to the reference integrated current amount Cs is greater than or equal to 98%, the state determining unit 46 may determine that the state of the battery 21 is as good as new. In order to make the above determination, the state determining unit 46 according to the present embodiment may store a table, etc., in which thresholds of the ratio and states of the battery 21 are associated with each other.

Note that in the example of FIG. 6, the integrated current amount comparing unit 45 calculates the ratio of the integrated current amount C with respect to the reference integrated current amount Cs, determines the state of the battery 21 based on the calculated ratio, and outputs a determination result; however, the present embodiment is not so limited.

The battery control device 30 may output only the ratio of the integrated current amount C with respect to the reference integrated current amount Cs calculated by the integrated current amount comparing unit 45, as the information indicating the state of the battery 21. Furthermore, the battery control device 30 may display both the ratio calculated by the integrated current amount comparing unit 45 and the state of the battery 21 determined by the state determining unit 46.

Furthermore, in the present embodiment, either one of the integration start voltage Vs1 or the integration end voltage Vs2 is preferably a value that is greater than the average value (average output voltage) of the battery voltage output from the battery 21.

In the present embodiment, as described above by referring to FIG. 6, when the battery voltage of the battery 21 is less than the integration start voltage Vs1, the process of outputting the state of the battery 21 is started. Said differently, this indicates that the state of the battery 21 is not output until the battery voltage becomes less than the integration start voltage Vs1.

Thus, in the present embodiment, either the integration start voltage Vs1 or the integration end voltage Vs2 has been set to be a value that is greater than the average output voltage of the battery 21. More preferably, the integration start voltage Vs1 is to be a value greater than the average output voltage.

By setting the integration start voltage Vs1 as described above, the process of outputting the state of the battery 21 can be executed in a state where the battery voltage of the battery 21 is a relatively high value. Therefore, the frequency of executing the process of outputting the state of the battery 21 is increased, and a change in the state of the battery 21 can be quickly detected.

Note that in the present embodiment, the process of FIG. 6 may be executed every time the battery voltage of the battery 21 becomes less than the integration start voltage Vs1. Furthermore, in this case, the battery control device 30 may output the information indicating the state of the battery 21 every time the process of FIG. 6 is executed, or may output the information indicating the state of the battery 21 at every predetermined time period.

In the following, by referring to FIG. 7, a description is given of the information indicating the state of the battery 21 output from the state outputting unit 47.

Figure 7:
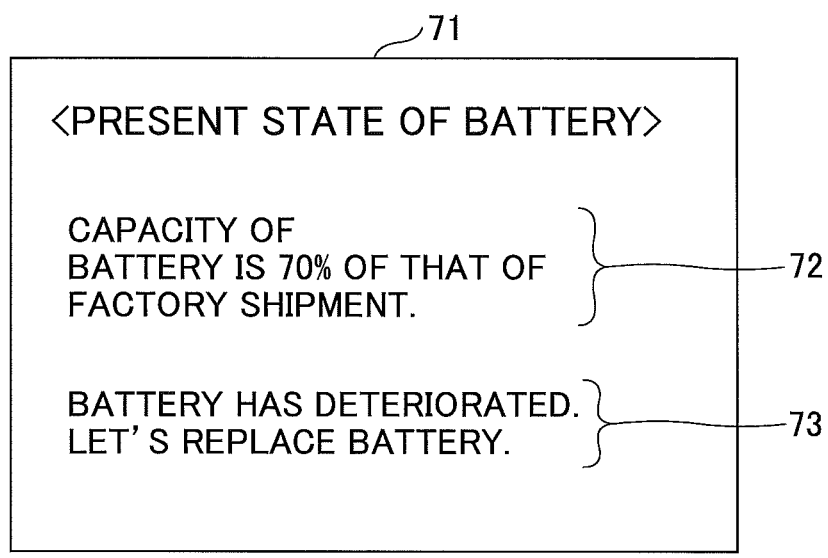
FIG. 7 illustrates an example of information indicating the state of a battery according to the first embodiment of the present invention.

FIG. 7 illustrates an example of information indicating the state of the battery 21. FIG. 7 illustrates an example in which the electronic device 10 includes a display unit 71 such as a display, etc., and the information indicating the state of the battery 21 is displayed on the display unit 71.

The display unit 71 of FIG. 7 displays, as the information indicating the state of the battery 21, information 72 indicating the ratio of the integrated current amount C with respect to the reference integrated current amount Cs, and information 73 indicating the state determined by the state determining unit 46.

The information 72 displayed in the display unit 71 indicates that the present integrated current amount (capacity) of the battery 21 has decreased down to 70%, compared to the integrated current amount (capacity) at the time of factory shipment. Furthermore, the information 73 displayed in the display unit 71 indicates that the battery 21 has deteriorated to a level at which replacement is prompted.

As described above, according to the present embodiment, the state of the power storage device can be detected without completely discharging the battery 21. Therefore, according to the present embodiment, it is possible to suppress the deterioration of the power storage device that is caused by detecting the state of the power storage device. Furthermore, according to the present embodiment, the power storage device does not need to be completely discharged in order to detect the state of the power storage device, and therefore the convenience of the user can be improved.

Note that in the example of FIG. 7, the information 72 indicating the ratio of the integrated current amount C with respect to the reference integrated current amount Cs calculated by the integrated current amount comparing unit 45, and the information 73 indicating the state determined by the state determining unit 46 are both displayed; however, the present embodiment is not so limited. The information output by the state outputting unit 47 may be either one of the information 72 or the information 73.

Figure 8:
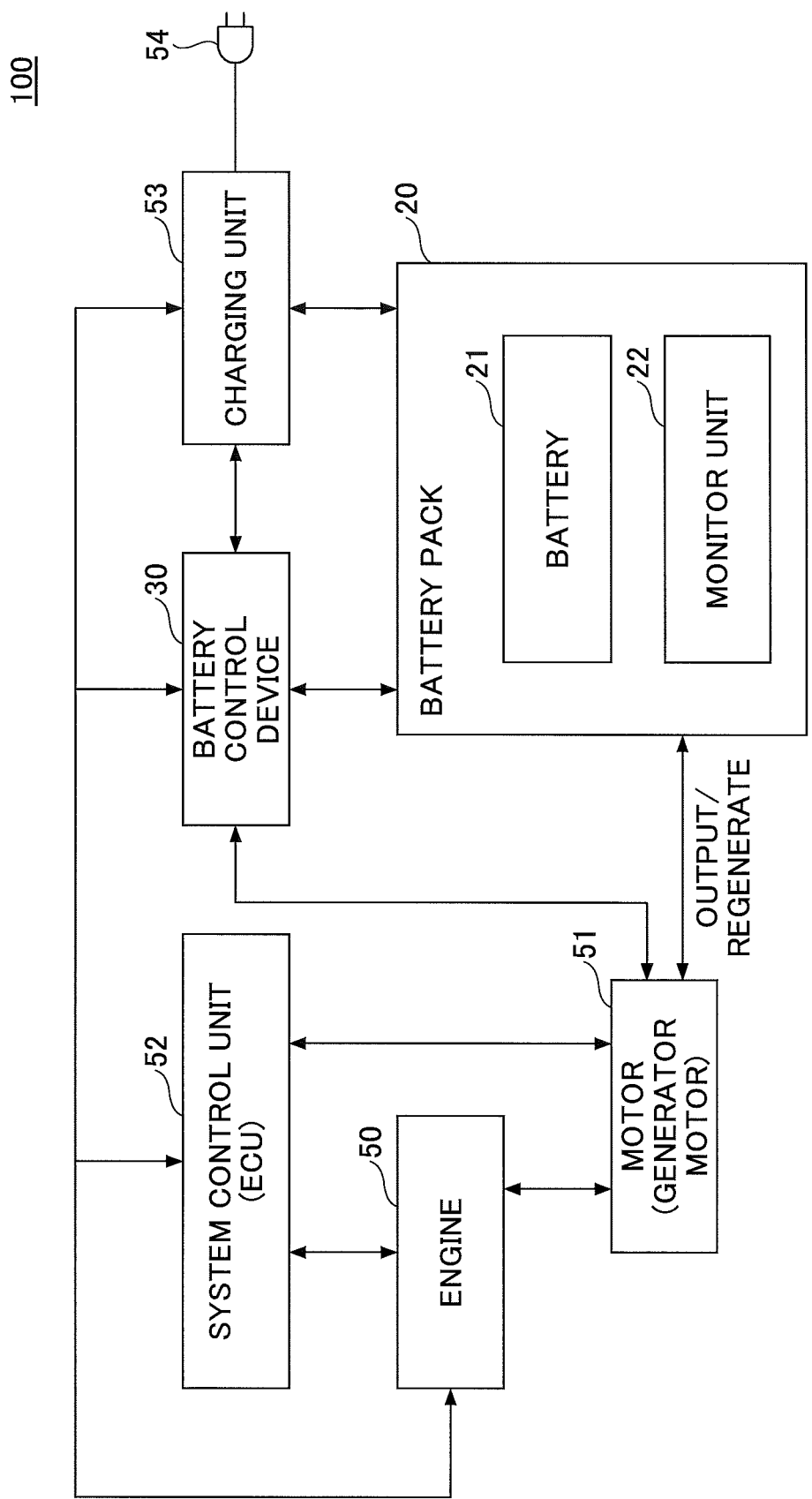
FIG. 8 illustrates a movable body to which the battery control device according to the first embodiment of the present invention is applied.

Next, a description is given of an application example of the battery control device 30 according to the present embodiment. FIG. 8 illustrates a movable body to which the battery control device 30 that is the state output apparatus according to the present embodiment is applied. In the example of FIG. 8, the electronic device 10 is the movable body.

A movable body 100 illustrated in FIG. 8 is a hybrid vehicle to which the battery control device 30 that is the state output apparatus according to the present embodiment is applied.

The movable body 100 includes the battery pack 20, the battery control device 30, an engine 50, a motor 51, a system control unit 52, and a charging unit 53.

The engine 50 is a known internal combustion engine that uses gasoline and diesel oil, etc., as fuel. The motor 51 is a known generator motor that functions as an electric motor and an electric generator. Note that the battery 21 according to the present embodiment has a role of supplying power when the motor 51 functions as an electric motor, and a role of storing regenerative energy when the motor 51 functions as an electric generator.

In a hybrid vehicle including a Plug-in Hybrid Electric Vehicle (PHEV) and a Hybrid Electric Vehicle (HEV), the engine 50 and the motor 51 are used in combination. The hybrid vehicle travels by at least one of the power output from the engine 50 and the power output from the motor 51.

The system control unit 52 is an Electronic Control Unit (ECU) that can control the switching between an Electric Vehicle (EV) mode of operating only by the power from the motor 51, and a Hybrid Electric Vehicle (HEV) mode of operating by using the power from the motor 51 and the power from the engine 50 in combination. The system control unit 52 may also be able to control various operations such as controlling the charging of the battery 21 and controlling the regeneration operation.

The system control unit 52 may include, for example, a Central Processing Unit (CPU), a Read-Only Memory (ROM), Random Access Memory (RAM), and a main memory, etc. In this case, various functions of the system control unit 52 are realized as programs recorded in the ROM, etc., are loaded in the main memory and executed by the CPU. The CPU of the system control unit 52 may read the data from the RAM and store the data, according to need.

In the movable body 100, the battery control device 30 charges the battery 21 via the charging unit 53. Note that when the movable body 100 is a PHEV, the charging unit 53 is provided with an external power plug 54, and the battery 21 may be directly charged by plugging the external power plug 54 into a receptacle. For example, the battery control device 30 according to the present embodiment may detect the state of the battery 21, while charging the battery 21 by plugging the external power plug 54 into a household receptacle. Alternatively, the battery control device 30 according to the present embodiment may detect the state of the battery 21, while charging the battery 21 at a gas station.

Note that in the movable body 100, the system control unit 52 may assume some of the functions of the battery control device 30, and the battery control device 30 may assume some of the functions of the system control unit 52. Furthermore, the system control unit 52 and the battery control device 30 may be physically realized as a single ECU, or may be realized three or more ECUs.

FIG. 8 illustrates the movable body 100 as one example of the electronic device 10 to which the battery control device 30 is applied; however, the present embodiment is not so limited.

The battery control device 30 according to the present embodiment is applicable to any kind of device, as long as the device has a secondary battery that can be charged and discharged. For example, the battery control device 30 may be applied to a smartphone, a tablet terminal, a notebook computer, a power tool, and a power-assisted bicycle, etc.

Second Embodiment

A second embodiment of the present invention will be described by referring to the accompanying drawings. The second embodiment is different from the first embodiment in that there are a plurality of combinations of the integration start voltage Vs1 and the integration end voltage Vs2 for each temperature level. Thus, in the following description of the second embodiment, only the parts that are different from those of the first embodiment are described, and functional elements that are the same as those of the first embodiment are denoted by the same reference numerals and overlapping descriptions are omitted.

Figure 9:
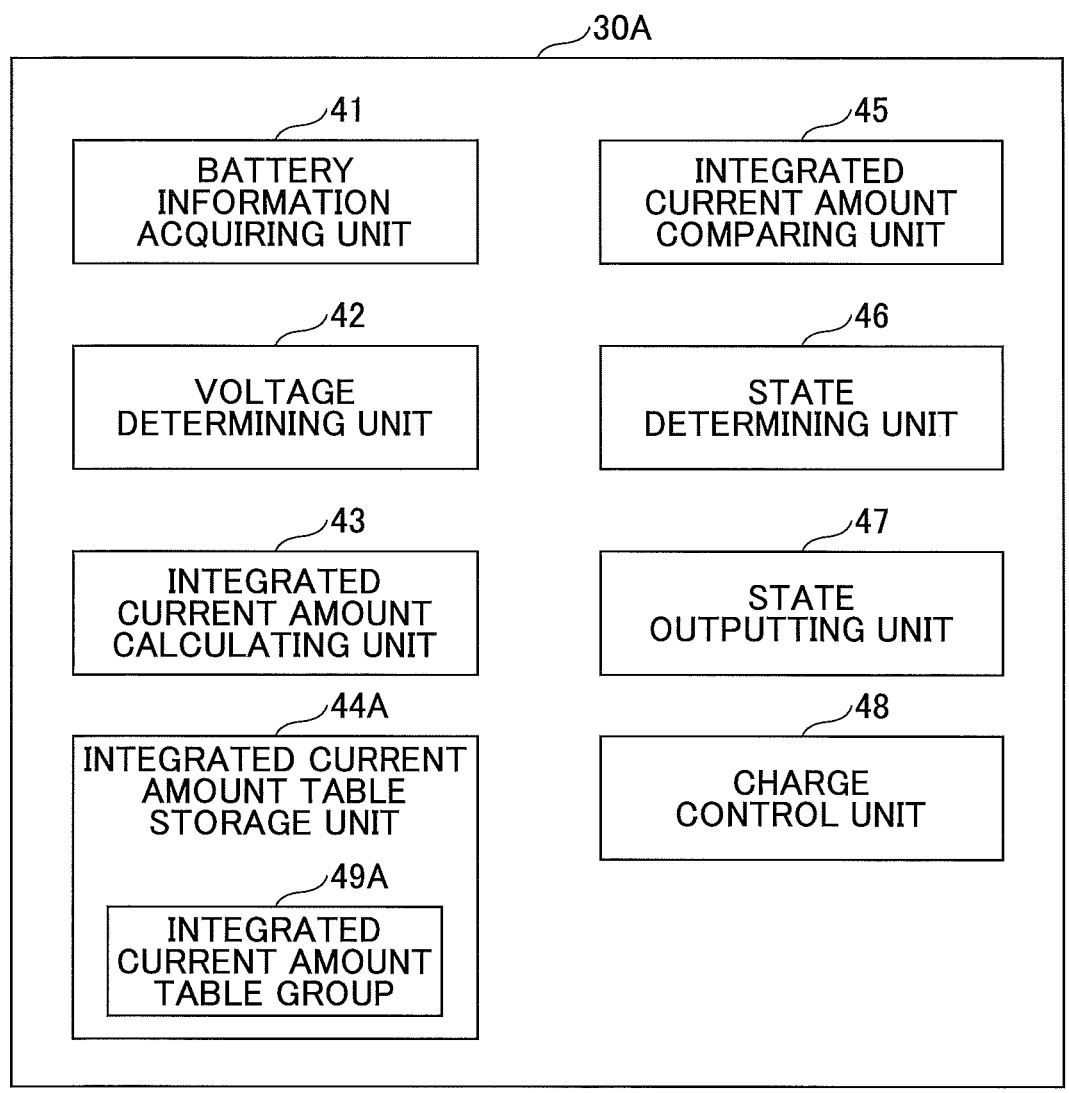
FIG. 9 illustrates functions of the battery control device according to a second embodiment of the present invention.

FIG. 9 illustrates functions of the battery control device 30 according to the second embodiment. A battery control device 30A according to the present embodiment includes the battery information acquiring unit 41, the voltage determining unit 42, the integrated current amount calculating unit 43, an integrated current amount table storage unit 44A, the integrated current amount comparing unit 45, the state determining unit 46, the state outputting unit 47, and the charge control unit 48.

The units of the battery control device 30A according to the present embodiment are the same as those of the first embodiment, except for the integrated current amount table storage unit 44A.

The integrated current amount table storage unit 44A according to the present embodiment stores an integrated current amount table group 49A. The integrated current amount table group 49A according to the present embodiment includes tables in which a plurality of combinations of the integration start voltage Vs1 and the integration end voltage Vs2 are associated with each temperature level.

FIGS. 10A through 10D illustrate examples of integrated current amount tables according to the second embodiment. An integrated current amount table 49-1 illustrated in FIG. 10A is referred to when the temperature included in the battery information is "0° C. through 10° C."; and an integrated current amount table 49-2 illustrated in FIG. 10B is referred to when the temperature included in the battery information is "11° C. through 20° C.".

Furthermore, an integrated current amount table 49-3 illustrated in FIG. 10C is referred to when the temperature included in the battery information is "21° C. through 30° C."; and an integrated current amount table 49-4 illustrated in FIG. 10D is referred to when the temperature included in the battery information is "31° C. through 40° C.".

In the integrated current amount table 49-1, with respect to the temperature of "0° C. through 10° C.", a combination in which the integration start voltage Vs1 is 3.9 V and the integration end voltage Vs2 is 4.1 V, and combination in which the integration start voltage Vs1 is 3.8 V and the integration end voltage Vs2 is 4.1 V, are associated. Furthermore, in the integrated current amount table 49-1, with respect to the temperature of "0° C. through 10° C.", a combination in which the integration start voltage Vs1 is 3.7 V and the integration end voltage Vs2 is 4.0 V, and combination in which the integration start voltage Vs1 is 3.6 V and the integration end voltage Vs2 is 3.9 V, are associated. Furthermore, a reference integrated current amount is associated with each combination. The integrated current amount tables 49-2, 49-3, and 49-4 are similar to the integrated current amount table 49-1.

Figure 11:
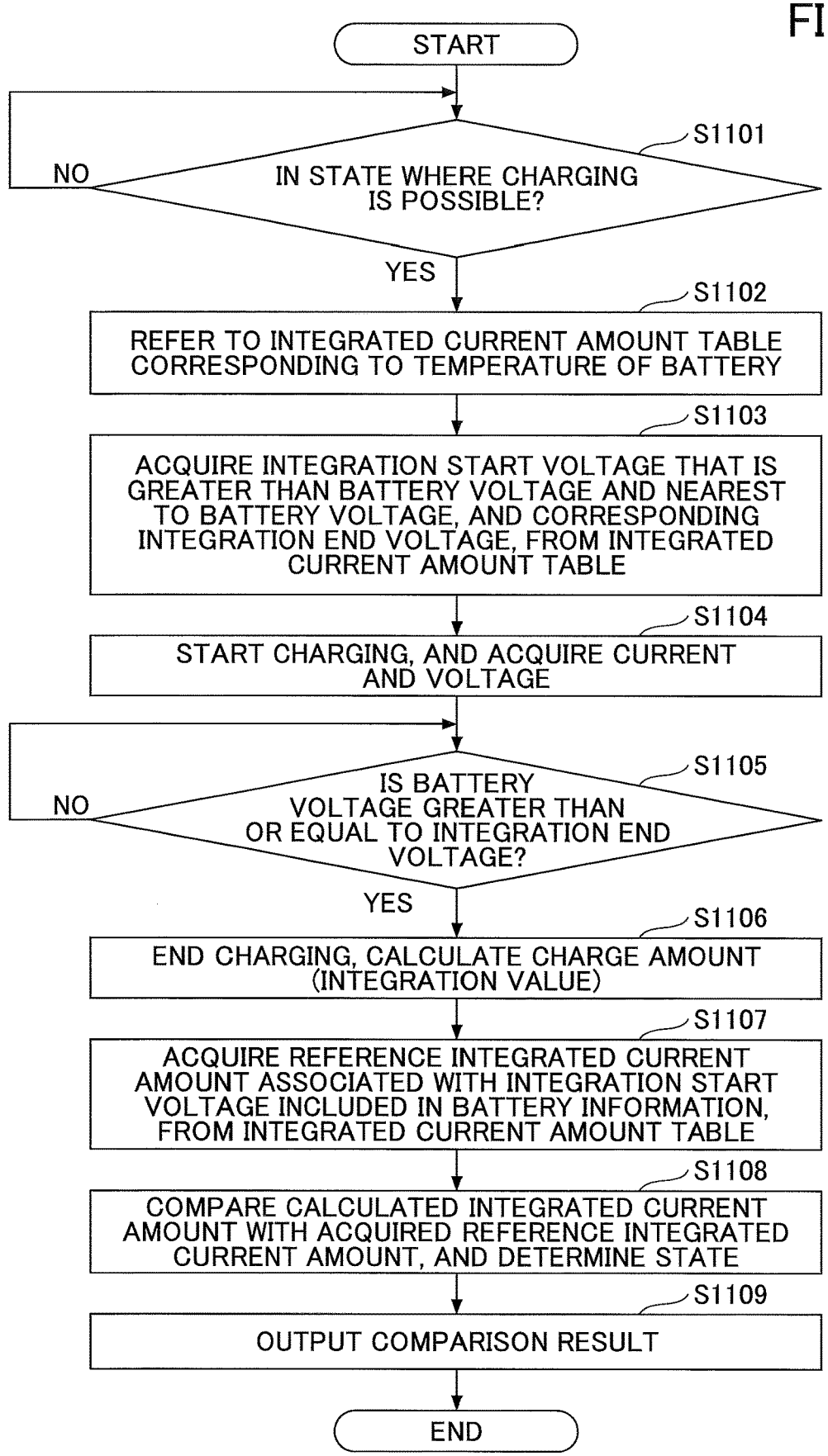
FIG. 11 is a flowchart for describing the operations by the battery control device according to the second embodiment of the present invention.

Next, by referring to FIG. 11, a description is given of operations by the battery control device 30A according to the present embodiment. FIG. 11 is a flowchart for describing the operations by the battery control device 30A according to the second embodiment.

The battery control device 30A according to the present embodiment determines, by the charge control unit 48, whether the battery 21 is in a state where charging is possible (step S1101). A state where charging is possible is, for example, a state in which a power supply source such as a battery charger is coupled to the battery pack 20.

In step S1101, when the battery 21 is not in a state where charging is possible, the battery control device 30A waits until the battery 21 switches to a state where charging is possible.

In step S1101, when the battery 21 is in a state where charging is possible, the battery control device 30A starts acquiring (collecting) battery information by the battery information acquiring unit 41, and acquires the integrated current amount table associated with the temperature included in the battery information in the integrated current amount table group 49A (step S1102).

Next, the battery control device 30A acquires, by the voltage determining unit 42, the integration start voltage Vs1 that is greater than the battery voltage included in the battery information and that is nearest to the battery voltage, and the integration end voltage Vs2 corresponding to this integration start voltage Vs1, from the integrated current amount table acquired in step S1102 (step S1103).

The processes from steps S1104 through S1106 of FIG. 11 are the same as the processes from steps S604 through S606 of FIG. 6, and therefore descriptions of these processes are omitted.

After step S1106, the battery control device 30A acquires the reference integrated current amount Cs associated with the integration start voltage Vs1 and the integration end voltage Vs2 acquired in step S1103 (step S1107).

The processes of steps S1108 and S1109 of FIG. 11 are the same as the processes of steps S608 and S609 of FIG. 6, and therefore descriptions of these processes are omitted.

As described above, in the present embodiment, am integrated current amount table, which includes a plurality of combinations of the integration start voltage Vs1 and the integration end voltage Vs2 and a reference integrated current amount associated with each of the plurality of combinations, is provided for each temperature level. Therefore, according to the present embodiment, regardless of the value of battery voltage in the state where charging of the battery 21 is possible, it is possible to compare the integrated current amount integrated during a period in which battery voltage changes from the integration start voltage Vs1 to the integration end voltage Vs2, with the reference integrated current amount Cs.

Furthermore, in the present embodiment, the integration start voltage Vs1 that is nearest to the battery voltage when the battery 21 switches to a state where charging is possible, and the integration end voltage Vs2 associated with this integration start voltage Vs1, are acquired from the integrated current amount table, to calculate the integrated current amount. Therefore, according to the present embodiment, the state of the battery 21 can be quickly determined, when the battery 21 switches to a state where charging is possible.

According to one embodiment of the present invention, the state of the power storage device can be detected without completely discharging the power storage device.

The state output apparatus, the state output method of the power storage device, and the recording medium are not limited to the specific embodiments described in the detailed description, and variations and modifications may be made without departing from the spirit and scope of the present invention.

What is claimed is:

1. A state output apparatus comprising:
a power storage device information acquirer configured to acquire power storage device information including a voltage, a current and a temperature of a power storage device;
an integrated current amount calculator configured to calculate an integrated current amount that is defined as an integrated amount of current supplied to the power storage device during a period in which the voltage increases from a first voltage to a second voltage between a discharge end voltage and a charge end voltage by charging the power storage device;
a storage device configured to store a plurality of tables, each of the plurality of tables being configured to manage a plurality of combinations of the first voltage, the second voltage, the reference integrated current amount and a predetermined different range of temperature of the power storage device for a plurality of present voltages of the power storage device so that a single combination of the first voltage, the second voltage, the reference integrated current amount and the predetermined range of temperature of the power storage device is determined for a given present voltage at a given temperature of the power storage device,
an integrated current amount comparer configured to compare the calculated integrated current amount with the reference integrated current amount stored in the storage device in;
a state outputter configured to output a result of the comparison as information indicating a state of the power storage device, and
wherein the first voltage and the second voltage are set to be lower as the temperature of the power storage device increases,
the discharge end voltage and the charge end voltage are preliminarily set, and
the power storage device information acquirer is further configured to acquire a table, from the plurality of tables, including the first voltage, the second voltage and the reference integrated current amount based on the acquired temperature of the power storage device and acquire the single combination of the first voltage, the second voltage and the reference integrated current amount from the acquired table based on the present voltage.

2. The state output apparatus according to claim 1, wherein the first voltage and the second voltage are voltage values set in advance.

3. The state output apparatus according to claim 1, wherein the second voltage is higher than an average value of the voltage output from the power storage device.

4. The state output apparatus according to claim 3, wherein the first voltage is higher than the average value of the voltage output from the power storage device.

5. The state output apparatus according to claim 1, further comprising:
an integrated current amount table storage configured to store an integrated current amount table including the reference integrated current amount, in the storage device, wherein
in the integrated current amount table, the first voltage, the second voltage, and the reference integrated current amount are associated with each other, for each level of temperature of the power storage device,
the power storage device information includes the temperature of the power storage device,
the integrated current amount calculator calculates the integrated current amount based on the first voltage and the second voltage associated with the temperature of the power storage device in the integrated current amount table, and
the integrated current amount comparer compares the calculated integrated current amount with the reference integrated current amount associated with the temperature of the power storage device in the integrated current amount table.

6. The state output apparatus according to claim 1, wherein the reference integrated current amount indicates an integrated current amount supplied to the power storage device during the period in which the voltage changes from the first voltage to the second voltage by charging the power storage device, in a state where the power storage device is not deteriorated.

7. The state output apparatus according to claim 1, further comprising:
a state determiner configured to determine a level of deterioration of the power storage device based on the result of the comparison by the integrated current amount comparer, wherein
the state outputter includes information indicating the level of deterioration, which is a result of the determination by the state determiner, in the information indicating the state of the power storage device.

8. The state output apparatus according to claim 1, further comprising:
the power storage device; and
a monitor device configured to acquire the power storage device information.

9. The state output apparatus according to claim 1, wherein the integrated current amount calculator is configured to calculate the integrated current amount only when the voltage before the calculating is below the first voltage.

10. The state output apparatus according to claim 1, wherein the charge controller is configured to stop the charging of the power storage device until determining that the present voltage of the power storage device becomes less than the first voltage.

11. The state output apparatus according to claim 1, further comprising:
a voltage determiner configured to determine whether the present voltage of the power storage device is less than the first voltage and whether the present voltage of the power storage device is equal to or more than the second voltage;
a charge controller configured to start to charge the power storage device upon determining that the present voltage of the power storage device is less than the first voltage and stop to charge the power storage device upon determining that the present voltage of the power storage device is equal to or more than the second voltage.

12. The state output apparatus according to claim 1, wherein the plurality of different predetermined ranges of temperature of the power storage device includes a first range from 0° C. through 10° C., a second range from 11° C. through 20° C., a third range from 21° C. through 30° C., and a fourth range from 31° C. through 40° C.

13. The state output apparatus according to claim 1, wherein each of the plurality of tables for different predetermined ranges of temperature has different sets of combinations of the first voltages and the second voltages.

14. The state output apparatus according to claim 13, wherein the plurality of tables for different predetermined ranges of temperature have a temperature gradient so that a highest voltage combination including a highest first voltage and a highest second voltage in each different predetermined range of temperature become higher as the range of predetermined temperature decreases.

15. A non-transitory computer-readable recording medium storing a state output program that causes a computer to execute a process, the process comprising:
   acquiring power storage device information including a voltage, a current and a temperature of a power storage device;
   calculating an integrated current amount that is defined as an integrated amount of current supplied to the power storage device during a period in which the voltage increases from a first voltage to a second voltage between a discharge end voltage and a charge end voltage by charging the power storage device;
   acquiring a table, from the plurality of tables, including the first voltage, the second voltage and the reference integrated current amount for a predetermined range of temperature of the power storage based on the acquired temperature of the power storage device; said plurality of tables being stored in a storage device, and each of the plurality of tables being configured to manage a plurality of combinations of the first voltage, the second voltage, the reference integrated current amount and a predetermined different range of temperature of the power storage device for a plurality of present voltages of the power storage device so that a single combination of the first voltage, the second voltage, the reference integrated current amount and the predetermined different range of temperature of the power storage device is determined for a given present voltage at a given temperature of the power storage device;
   acquiring the single combination of the first voltage, the second voltage and the reference integrated current amount from the acquired table based on the present voltage;
   comparing the calculated integrated current amount with the reference integrated current amount stored in the storage device; and
   outputting a result of the comparison as information indicating a state of the power storage device,
   wherein the first voltage and the second voltage are set to be lower as the temperature of the power storage device increases, and
   the discharge end voltage and the charge end voltage are preliminarily set.

16. A state output method executed by a computer, the state output method comprising:
   acquiring power storage device information including a voltage, a current and a temperature of a power storage device;
   calculating an integrated current amount that is defined as an integrated amount of current supplied to the power storage device during a period in which the voltage increases from a first voltage to a second voltage between a discharge end voltage and a charge end voltage by charging the power storage device;
   acquiring a table, from the plurality of tables, including the first voltage, the second voltage and the reference integrated current amount for a predetermined range of temperature of the power storage based on the acquired temperature of the power storage device, said plurality of tables being stored in a storage device, each of the plurality of tables being configured to manage a plurality of combinations of the first voltage, the second voltage, the reference integrated current amount and a predetermined different range of temperature of the power storage device for a plurality of present voltages of the power storage device for a different predetermined range of temperature of the power storage device so that a single combination of the first voltage, the second voltage, the reference integrated current amount and the predetermined different range of temperature of the power storage device is determined for a given present voltage at a given temperature of the power storage device;
   acquiring the single combination of the first voltage, the second voltage and the reference integrated current amount from the acquired table based on the present voltage;
   comparing the calculated integrated current amount with a reference integrated current amount stored in a storage device; and
   outputting a result of the comparison as information indicating a state of the power storage device,
   wherein the first voltage and the second voltage are set to be lower as the temperature of the power storage device increases, and
   the discharge end voltage and the charge end voltage are preliminarily set.

* * * * *